(12) United States Patent
Kimizuka

(10) Patent No.: US 12,740,167 B2
(45) Date of Patent: Sep. 15, 2026

(54) SOLID-STATE IMAGING ELEMENT WITH FIN-TYPE TRANSISTORS

(71) Applicant: SONY GROUP CORPORATION, Tokyo (JP)

(72) Inventor: Naohiko Kimizuka, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 462 days.

(21) Appl. No.: 18/254,021

(22) PCT Filed: Nov. 17, 2021

(86) PCT No.: PCT/JP2021/042209
§ 371 (c)(1),
(2) Date: May 23, 2023

(87) PCT Pub. No.: WO2022/118654
PCT Pub. Date: Jun. 9, 2022

(65) Prior Publication Data

US 2023/0420467 A1 Dec. 28, 2023

(30) Foreign Application Priority Data

Dec. 4, 2020 (JP) ................................ 2020-202204

(51) Int. Cl.
*H10F 39/00* (2025.01)
*H10F 39/18* (2025.01)

(52) U.S. Cl.
CPC ..... *H10F 39/80377* (2025.01); *H10F 39/014* (2025.01); *H10F 39/18* (2025.01)

(58) Field of Classification Search
CPC .. H10F 39/80377; H10F 39/014; H10F 39/18; H10F 39/12; H10F 39/80373;
(Continued)

(56) References Cited

U.S. PATENT DOCUMENTS 5,625,210 A * 4/1997 Lee ........................ H10F 39/014
257/292
2006/0081887 A1* 4/2006 Lyu ...................... H10F 39/803
257/E27.131

(Continued)

FOREIGN PATENT DOCUMENTS

JP 2006-121093 A 5/2006
JP 2014-011253 A 1/2014

(Continued)

OTHER PUBLICATIONS

International Search Report and Written Opinion of PCT Application No. PCT/JP2021/042209, issued on Jan. 18, 2022, 11 pages of ISRWO.

*Primary Examiner* — Duy T Nguyen
(74) *Attorney, Agent, or Firm* — CHIP LAW GROUP

(57) ABSTRACT

Provided is a solid-state imaging element including a plurality of pixels on a surface of a substrate. Each of the plurality of pixels includes a photoelectric conversion section, a first transistor having one end connected to the photoelectric conversion section, a second transistor, and a third transistor. The second transistor includes a first channel region extending in a direction substantially perpendicular to the surface of the substrate, and a first gate electrode provided on an upper surface and both side surfaces of the first channel region and connected to another end of the first transistor. The third transistor has a second channel region extending in a direction substantially perpendicular to the surface of the substrate, and a second gate electrode provided on an upper surface and both side surfaces of the second channel region.

9 Claims, 12 Drawing Sheets

(58) Field of Classification Search
CPC ... H10F 39/8037; H10F 39/811; H10D 84/00; H10D 84/0126; H10D 84/038; H10D 84/83; H10D 30/62
USPC .......................................................... 257/292
See application file for complete search history.

(56) References Cited

U.S. PATENT DOCUMENTS

2011/0241079 A1 * 10/2011 Oike ................. H10F 39/80377
257/E27.15
2014/0002704 A1 * 1/2014 Kido ...................... H04N 25/65
348/308

FOREIGN PATENT DOCUMENTS

JP 2016-021479 A 2/2016
WO 2020/129694 A1 6/2020
WO WO2020183937 A1 * 9/2020

* cited by examiner

Figure 1:
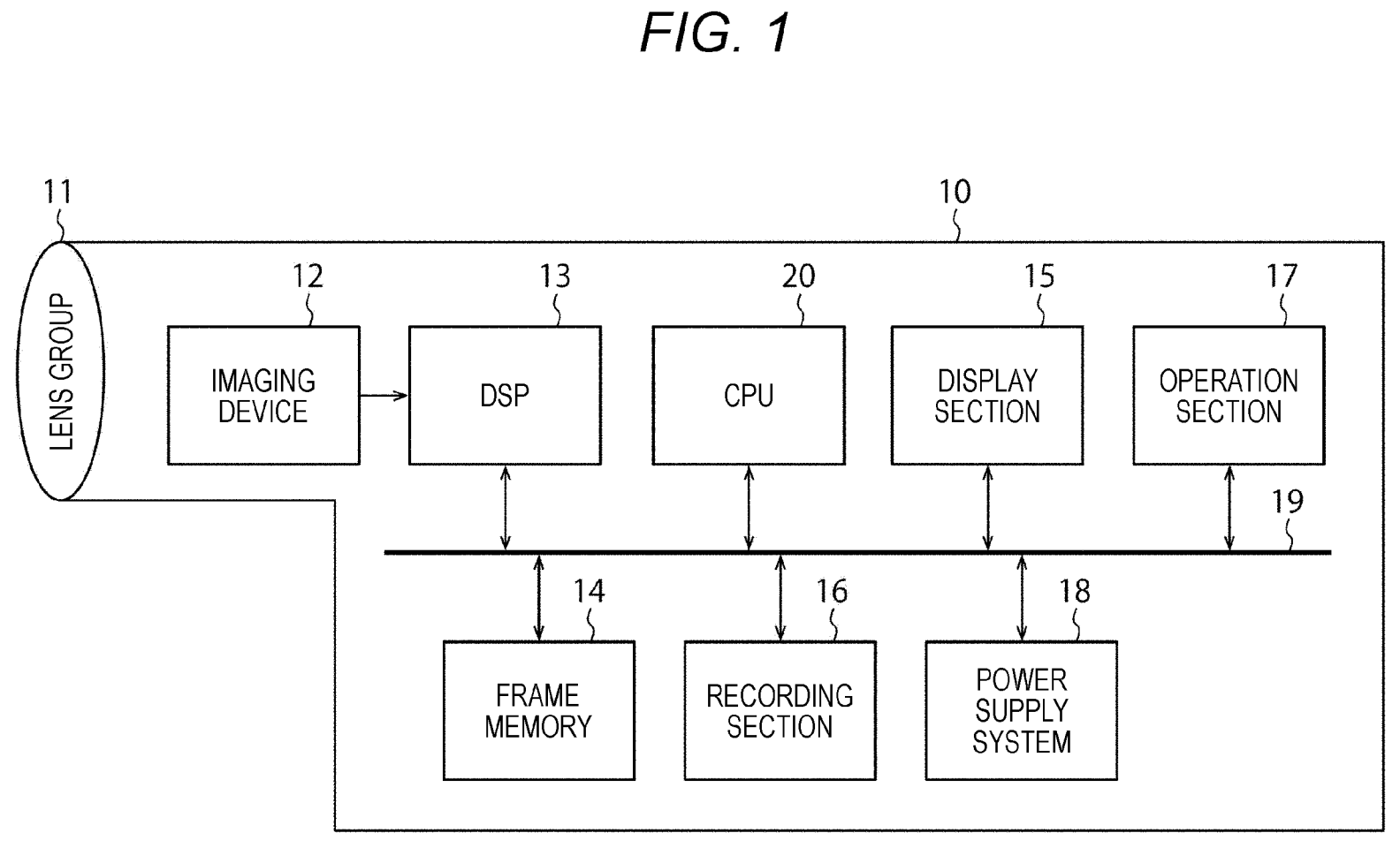

11 LENS GROUP

12 IMAGING DEVICE

13 DSP

20 CPU

15 DISPLAY SECTION

17 OPERATION SECTION

19

14 FRAME MEMORY

16 RECORDING SECTION

18 POWER SUPPLY SYSTEM

SOLID-STATE IMAGING ELEMENT WITH FIN-TYPE TRANSISTORS

CROSS REFERENCE TO RELATED APPLICATIONS

This application is a U.S. National Phase of International Patent Application No. PCT/JP2021/042209 filed on Nov. 17, 2021, which claims priority benefit of Japanese Patent Application No. JP 2020-202204 filed in the Japan Patent Office on Dec. 4, 2020. Each of the above-referenced applications is hereby incorporated herein by reference in its entirety.

TECHNICAL FIELD

The present disclosure relates to a solid-state imaging element.

BACKGROUND ART

There is a case where a Fin-type field effect transistor (FET) is applied to a transistor used for each pixel of a solid-state imaging element. In this case, impurities are introduced into a channel region in order to adjust characteristics of the transistor of the pixel.

CITATION LIST

Patent Document

Patent Document 1: Japanese Patent Application Laid-Open No. 2006-121093

SUMMARY OF THE INVENTION

Problems to be Solved by the Invention

However, when an interval between adjacent transistors is narrowed due to miniaturization of pixels, there is a possibility that impurities introduced for adjustment of one transistor diffuse into a channel region of another transistor. Therefore, adjustment of characteristics of each transistor of a pixel and miniaturization of the pixel have been in a trade-off relationship. Furthermore, an impurity introduction process has been required to adjust characteristics of the transistor. This leads to a problem of increasing manufacturing cost of the solid-state imaging element.

Therefore, the present disclosure provides a solid-state imaging element capable of achieving both adjustment of characteristics of a transistor of a pixel and miniaturization of the pixel.

Solutions to Problems

A solid-state imaging element according to one aspect of the present disclosure is a solid-state imaging element including a plurality of pixels provided on a surface of a substrate, each of the pixels including: a photoelectric conversion section configured to convert light into an electric charge; a first transistor having one end connected to the photoelectric conversion section; a second transistor provided between a first power supply and a first signal line; and a third transistor connected between the second transistor and the first signal line, in which the second transistor includes a first channel region extending in a direction substantially perpendicular to the surface of the substrate, and a first gate electrode provided on an upper surface and both side surfaces of the first channel region and connected to another end of the first transistor, the third transistor has a second channel region extending in a direction substantially perpendicular to the surface of the substrate, and a second gate electrode provided on an upper surface and both side surfaces of the second channel region, and a first width between both side surfaces of the first channel region and a second width between both side surfaces of the second channel region are different from each other.

Impurity concentrations of the first and second channel regions are substantially equal.

In a case where the second width is larger than the first width, a threshold voltage of the third transistor is lower than a threshold voltage of the second transistor. In a case where the second width is smaller than the first width, a threshold voltage of the third transistor is higher than a threshold voltage of the second transistor.

The first and second channel regions are connected in series between the first power supply and the first signal line.

The first and second channel regions are made by a material same as the substrate to be integrally continuous.

A channel region of the first transistor extends in a direction substantially perpendicular to the surface of the substrate, and a gate electrode of the first transistor is provided on an upper surface and both side surfaces of the channel region of the first transistor.

A fourth transistor connected between the one end of the first transistor and the first power supply is further provided, a channel region of the fourth transistor extends in a direction substantially perpendicular to the surface of the substrate, and a gate electrode of the fourth transistor is provided on an upper surface and both side surfaces of the channel region of the fourth transistor.

The first transistor transfers an electric charge from the photoelectric conversion section to a floating diffusion region capable of temporarily accumulating the electric charge, and the second transistor is brought into a conductive state according to a voltage of the floating diffusion region. When each of the pixels is selected, the third transistor electrically connects the second transistor to the first signal line and transmits an electric signal corresponding to a voltage of the floating diffusion region to the first signal line, and the fourth transistor is brought into a conductive state when an electric charge in the floating diffusion region is removed to the first power supply.

The second and third transistors are Fin-type transistors.

A method for manufacturing a solid-state imaging element according to one aspect of the present disclosure is a method for manufacturing a solid-state imaging element including a plurality of pixels, the solid-state imaging element including a plurality of pixels provided on a surface of a substrate, each of the pixels including: a photoelectric conversion section configured to convert light into an electric charge; a first transistor having one end connected to the photoelectric conversion section; a second transistor provided between a first power supply and a first signal line; and a third transistor connected between the second transistor and the first signal line, the method including: selectively etching the surface of the substrate to form a first channel region of the second transistor and a second channel region of the third transistor, the first channel region having a first width and extending in a direction substantially perpendicular to the surface of the substrate, and the second channel region having a second width and extending in a direction substantially perpendicular to the surface of the substrate; forming a first gate electrode of the second transistor on an upper surface and both side surfaces of the first channel region, and forming a second gate electrode of the third transistor on an upper surface and both side surfaces of the second channel region, in which the first width and the second width are different from each other.

Impurity concentrations of the first and second channel regions are substantially equal.

The first and second channel regions are made by a material same as the substrate to be integrally continuous.

After the first and second channel regions are formed, no impurity is introduced into the first and second channel regions.

BRIEF DESCRIPTION OF DRAWINGS

FIG. 1 is a block diagram illustrating a configuration example of an imaging device which is an example of an electronic apparatus of the present disclosure.

MODE FOR CARRYING OUT THE INVENTION

Figure 2:
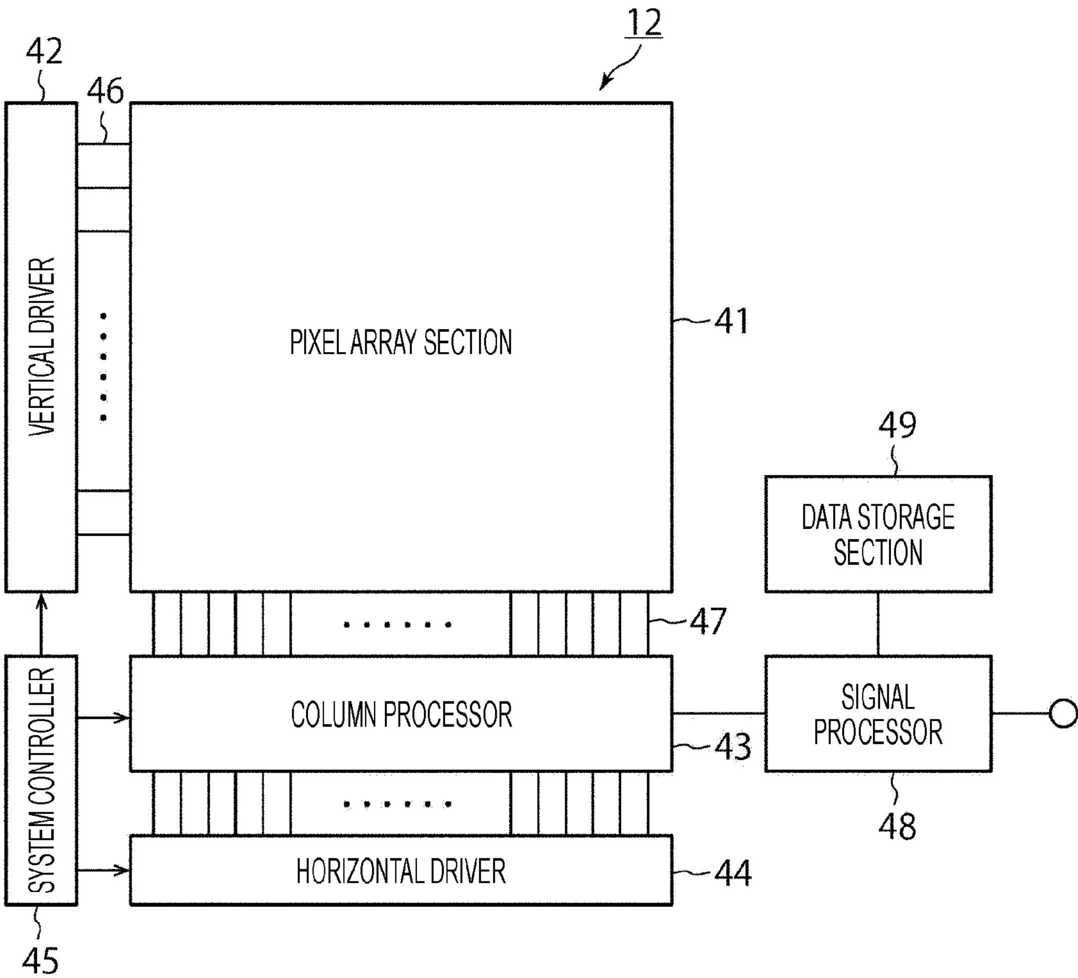
FIG. 2 is a block diagram illustrating a configuration example of an imaging element.

Hereinafter, a specific embodiment to which the present technology is applied will be described in detail with reference to the drawings. The drawings are schematic or conceptual, and the ratio of each portion and the like are not necessarily the same as actual ones. In the description and the drawings, elements similar to those described above with respect to previously described drawings are denoted by the same reference numerals, and detailed descriptions thereof are appropriately omitted.

First Embodiment

FIG. 1 is a block diagram illustrating a configuration example of an imaging device that is an example of an electronic apparatus according to the present disclosure. As shown in FIG. 1, an imaging device 10 includes an optical system including a lens group 11 and the like, an imaging element 12, a DSP circuit 13 serving as a camera signal processor, a frame memory 14, a display section 15, a recording section 16, an operation system 17, a power supply system 18, and the like. In this configuration, the DSP circuit 13, the frame memory 14, the display section 15, the recording section 16, the operation system 17, and the power supply system 18 are interconnected via a bus line 19. A CPU 20 controls each section in the imaging device 10.

The lens group 11 captures incident light (image light) from a subject and forms an image on an imaging surface of the imaging element 12. The imaging element 12 converts the amount of incident light formed into an image on the imaging surface by the lens group 11 into an electric signal on a pixel-by-pixel basis and outputs the electric signal as a pixel signal. As the imaging element 12, an imaging element (image sensor) including pixels described below can be used.

The display section 15 includes a panel-type display section such as a liquid crystal display section or an organic electro luminescence (EL) display section, and displays a moving image or a still image captured by the imaging element 12. The recording section 16 records the moving image or the still image captured by the imaging element 12 on a recording medium such as a hard disk drive (HDD) or a solid state drive (SSD).

The operation system 17 issues operation commands for various functions of the imaging device according to an operation performed by a user. The power supply system 18 appropriately supplies various power supplies, which are operation power supplies for the DSP circuit 13, the frame memory 14, the display section 15, the recording section 16, and the operation system 17, to these power supply targets.

FIG. 2 is a block diagram showing a configuration example of the imaging element 12. The imaging element 12 is only required to be a complementary metal oxide semiconductor (CMOS) image sensor that images a subject and obtains an imaged image as an electric signal. The imaging element 12 includes a pixel array section 41, a vertical driver 42, a column processor 43, a horizontal driver 44, and a system controller 45. The pixel array section 41, the vertical driver 42, the column processor 43, the horizontal driver 44, and the system controller 45 are formed on a semiconductor substrate (chip) not shown.

In the pixel array section 41, unit pixels are two-dimensionally arrayed in a matrix, each unit pixel having a photoelectric conversion element that generates photoelectric charges in an electric charge amount corresponding to an amount of incident light and accumulates the generated photoelectric charges therein. Note that, in the following, photoelectric charges in an amount corresponding to the amount of incident light may be simply referred to as "electric charges", and the unit pixel may be simply referred to as "pixel".

The pixel array section 41 is also provided with pixel drive lines 46 and vertical signal lines 47 with respect to the pixels arrayed in a matrix. The pixel drive lines 46 are formed for each row along the horizontal direction (arraying direction of pixels in each pixel row) in the figure, and the vertical signal lines 47 (VSLs in FIG. 3) as first signal lines are formed for each column along the vertical direction (arraying direction of pixels in each column) in the figure. One ends of the pixel drive lines 46 are connected to output ends of the vertical driver 42 corresponding to the respective rows.

The imaging element 12 further includes a signal processor 48 and a data storage section 49. The signal processor 48 and the data storage section 49 may be implemented by an external signal processor, for example, a digital signal processor (DSP), provided on a separate substrate from the imaging element 12 or implemented by a process of software, or may be provided on the same substrate as the imaging element 12.

The vertical driver 42 is a pixel driver that includes a shift register, an address decoder, and the like, and that drives all pixels in the pixel array section 41 simultaneously or drives the pixels in the pixel array section 41 on, for example, a row-by-row basis. Although the specific configuration of the vertical driver 42 is not shown, the vertical driver 42 has a configuration including a read scanning system and a sweep scanning system. Alternatively, the vertical driver 42 has a configuration in which a batch sweep and a batch transfer are performed.

The read scanning system selectively scans the unit pixels in the pixel array section 41 sequentially on a row-by-row basis in order to read signals from the unit pixels. In a case of row driving (rolling shutter operation), as for sweep, sweep scan is performed on a row on which read scan is performed by the read scanning system prior to the read scan by a time corresponding to a shutter speed. Furthermore, in a case of global exposure (a global shutter operation), a batch sweep operation is performed prior to a batch transfer operation by the time corresponding to a shutter speed.

Due to the sweeping operation described above, unnecessary electric charges are swept (reset) from the photoelectric conversion elements of the unit pixels in the read row. Then, a so-called electronic shutter operation is performed by sweeping (resetting) the unnecessary charge. In this case, the electronic shutter operation means an operation in which photoelectric charges in the photoelectric conversion element are removed and exposure is started anew (accumulation of the photoelectric charges is started).

The signal which is read by the read operation of the read scanning system corresponds to an amount of light which is received immediately before the read operation or received after the electronic shutter operation. In a case of row driving, a period from the reading time by the preceding read operation or the sweeping time by the electronic shutter operation to the reading time by the current read operation is set to an accumulation period (an exposure period) of photoelectric charges in the unit pixel. In a case of the global exposure, a period from a batch sweep to a batch transfer is set to the accumulation period (the exposure period).

Pixel signals output from the unit pixels in the pixel row selectively scanned by the vertical driver 42 are supplied to the column processor 43 through the corresponding vertical signal lines 47. The column processor 43 performs, for each pixel column of the pixel array section 41, a predetermined signal process on pixel signals output from the unit pixels in the selected row through the vertical signal lines 47, and temporarily stores the pixel signals which have been subjected to the predetermined signal process.

Specifically, the column processor 43 or the signal processor 48 performs, as signal processing, at least noise removal processing, for example, correlated double sampling (CDS) processing. Due to the correlated double sampling by the column processor 43, fixed pattern noise unique to pixels, such as reset noise and variation in threshold value of an amplifier transistor, is removed. Note that the column processor 43 may have, for example, an analog-digital (AD) conversion function in addition to the noise removal function, and output a signal level in digital form.

The horizontal driver 44 includes a shift register, an address decoder, and the like, and sequentially selects a unit circuit corresponding to each column of pixels in the column processor 43. Due to the selective scanning by the horizontal driver 44, the pixel signals subjected to the signal process by the column processor 43 are sequentially output to the signal processor 48.

The system controller 45 includes a timing generator that generates various types of timing signals, and the like, and controls drives of the vertical driver 42, the column processor 43, the horizontal driver 44, and the like on the basis of various types of timing signals generated by the timing generator.

The signal processor 48 has at least an addition process function, and performs various signal processes such as an addition process on the pixel signal output from the column processor 43. The data storage section 49 temporarily stores data necessary for the signal process by the signal processor 48.

Figure 3:
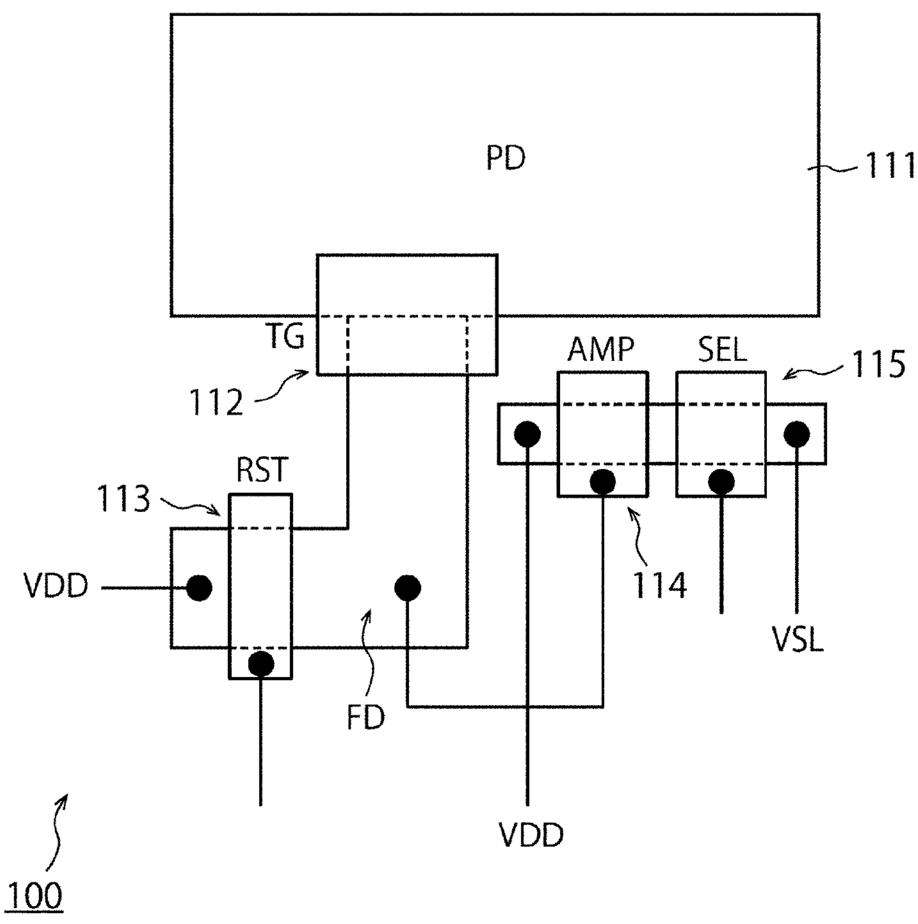
FIG. 3 is a plan view illustrating a configuration example of one pixel among a plurality of pixels constituting a pixel array section.
Figure 4:
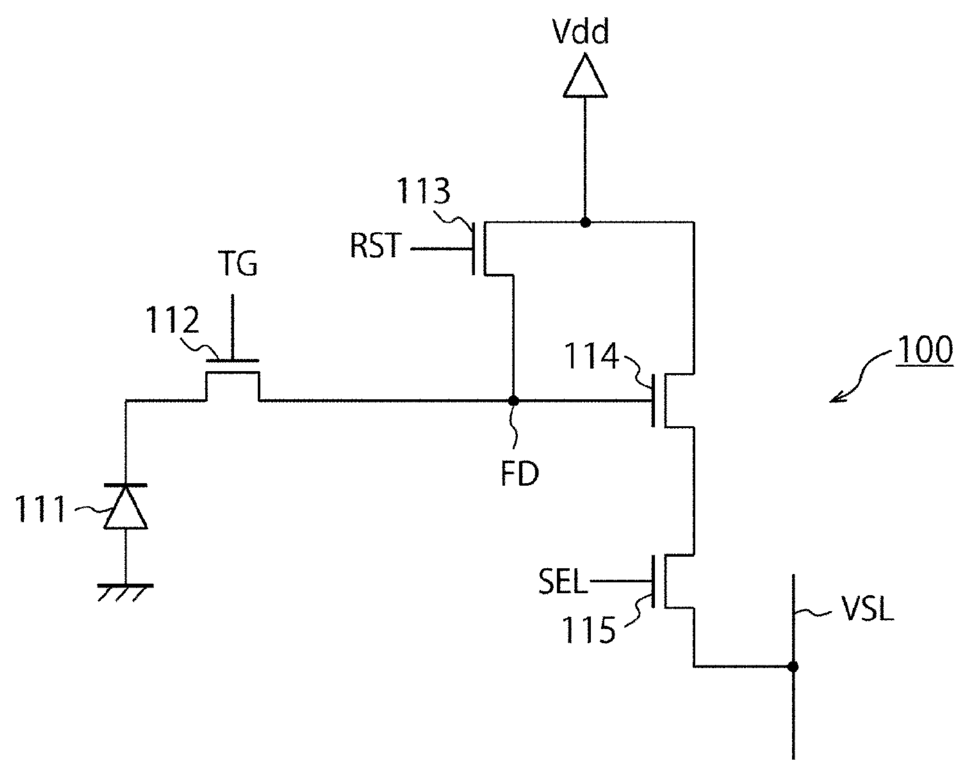
FIG. 4 is an equivalent circuit diagram illustrating a configuration example of a pixel.

FIG. 3 is a plan view illustrating a configuration example of one pixel 100 among a plurality of pixels constituting the pixel array section 41. FIG. 4 is an equivalent circuit diagram illustrating a configuration example of the pixel 100. The pixel array section 41 includes, for example, a plurality of pixels 100 two-dimensionally arranged in an array. Each pixel 100 photoelectrically converts incident light, and outputs a pixel signal of an imaged image.

The pixel 100 includes a photodiode (PD) 111, a transfer transistor (TG) 112, a reset transistor (RST) 113, an amplifier transistor (AMP) 114, and a selection transistor (SEL) 115. Note that, in a region other than the transistors and the photodiode 111, for example, an element isolation region is provided to electrically isolate from other pixels. The element isolation region includes an insulating film. In a case of electronic reading, the element isolation region may be formed by a p-type region. The transistors 112 to 115 may be an n-type transistor or a p-type transistor. Here, the transistors 112 to 115 will be described as an n-type transistor.

The photodiode 111 photoelectrically converts received light into an electric charge (here, an electron) of an amount corresponding to an amount of the light, and accumulates the electric charge. An anode of the photodiode 111 is connected to a ground of the pixel region, and a cathode is connected to a floating diffusion FD as a floating diffusion region via the transfer transistor 112. Note that the cathode of the photodiode 111 may be connected to a power supply (a pixel power supply) of the pixel region, and the anode may be connected to the floating diffusion FD via the transfer transistor 112. In this case, for the pixel 100, a method of reading electric charges as holes is adopted.

The transfer transistor 112 as a first transistor controls reading of photoelectric charges from the photodiode 111. A source as one end of the transfer transistor 112 is connected to the cathode of the photodiode 111. A drain as another end of the transfer transistor 112 is connected to the floating diffusion FD. Furthermore, a transfer control signal is supplied to a gate of the transfer transistor 112. Reading of electric charges from the photodiode 111 is controlled by this transfer control signal. For example, in a case where the transfer control signal (that is, a gate potential of the transfer transistor 112) is at a low level, the transfer transistor 112 is brought into an OFF state (a non-conductive state), and no electric charge is transferred from the photodiode 111. In a case where the transfer control signal (that is, a gate potential of the transfer transistor 112) is at a high level, the transfer transistor 112 is brought into an ON state (a conductive state), and transfers electric charges accumulated in the photodiode 111 to the floating diffusion FD. The floating diffusion FD is a diffusion layer capable of temporarily accumulating electric charges, and is provided in a surface region of a semiconductor substrate 121.

The reset transistor 113 as a fourth transistor resets electric charges in the pixel 100. The reset operation is, for example, an operation of removing electric charges (for example, electrons) of the photodiode 111 and the floating diffusion FD to a power supply VDD, or an operation of removing holes to the ground. A drain of the reset transistor 113 is connected to the power supply VDD, a source of the reset transistor 113 is connected to the floating diffusion FD, and is connected to a drain of the transfer transistor 112 via the floating diffusion FD. That is, the reset transistor 113 is connected between the drain of the transfer transistor 112 and the power supply VDD. Furthermore, a reset control signal is supplied to a gate of the reset transistor 113. The resetting of the electric charges in the pixel 100 is controlled by this reset control signal. For example, in a case where the reset control signal (that is, a gate potential of the reset transistor 113) is at a low level, the reset transistor 113 is brought into an OFF state, and resetting is not performed. In a case where the reset control signal (that is, a gate potential of the reset transistor 113) is at a high level, the reset transistor 113 is brought into an ON state, discharges the electric charges in the pixel 100 to the power supply VDD, and resets the floating diffusion FD and the photodiode 111.

The amplifier transistor 114 as a second transistor is brought into a conductive state according to a voltage of the floating diffusion FD. The amplifier transistor 114 amplifies a voltage change of the floating diffusion FD, and outputs the voltage change as an electric signal (an analog signal) to a vertical signal line VSL via the selection transistor 115. That is, the amplifier transistor 114 functions as a read circuit that reads a voltage of the floating diffusion FD. A gate of the amplifier transistor 114 is connected to the floating diffusion FD. A drain of the amplifier transistor 114 is connected to a source follower power supply voltage (VDD), and a source is connected to a drain of the selection transistor 115. That is, the amplifier transistor 114 is connected between the power supply (VDD) and the vertical signal line VSL. For example, the amplifier transistor 114 outputs a voltage of a reset level (P-phase) corresponding to a potential of the floating diffusion FD in a reset state, to the selection transistor 115. Furthermore, the amplifier transistor 114 outputs a voltage at a data level (D-phase) corresponding to a potential of the floating diffusion FD having accumulated the signal electric charges from the photodiode 111, to the selection transistor 115.

The selection transistor 115 as a third transistor controls output of an electric signal from the amplifier transistor 114 to the vertical signal line VSL. A gate of the selection transistor 115 is connected to the pixel drive line 46 in FIG. 2, and receives a selection control signal. The drain of the selection transistor 115 is connected to a source of the amplifier transistor 114, and a source of the selection transistor 115 is connected to the vertical signal line VSL as the first signal line. That is, the selection transistor 115 is connected between the source of the amplifier transistor 114 and the vertical signal line VSL. The amplifier transistor 114 and the selection transistor 115 are connected in series between the power supply VDD and the vertical signal line VSL. Furthermore, the selection transistor 115 controls output of an electric signal from the amplifier transistor 114 to the vertical signal line VSL, on the basis of a selection control signal. For example, in a case where the pixel 100 is unselected, the selection control signal (that is, a gate potential of the selection transistor 115) is at a low level. In this case, the selection transistor 115 is brought into an OFF state, and does not output an electric signal at the reset level or the data level from the amplifier transistor 114 to the vertical signal line VSL. In a case where the pixel 100 is selected, the selection control signal (that is, a gate potential of the selection transistor 115) becomes a high level. In this case, the selection transistor 115 is brought into an ON state, electrically connects the amplifier transistor 114 to the vertical signal line VSL, and outputs an electric signal corresponding to a voltage of the floating diffusion FD to the vertical signal line VSL. The vertical signal line VSL is connected to an A/D conversion circuit outside the pixel 100, and transfers an electric signal to the A/D conversion circuit. The A/D conversion circuit performs AD conversion on electric signals at the reset level and the data level. The column processor 43 or the signal processor performs CDS processing on an electric signal converted into a digital signal.

As described above, each pixel 100 can output an electric signal corresponding to incident light, to the vertical signal line VSL.

Meanwhile, in a case where the selection transistor 115 or the amplifier transistor 114 is a planar transistor, there is a possibility that random noise mixed in a signal increases. On the other hand, in the present embodiment, a multi-gate transistor is applied to the selection transistor 115 and the amplifier transistor 114 in order to suppress random noise. The multi-gate transistor is a non-planar transistor having a semiconductor region extending in a direction (a vertical direction) substantially perpendicular to a semiconductor substrate, and including a gate electrode facing an upper surface and both side surfaces of the semiconductor region. A channel is formed in the semiconductor region facing the gate electrode. By applying the multi-gate transistor to both the selection transistor 115 and the amplifier transistor 114, effective channel widths of the selection transistor 115 and the amplifier transistor 114 can be expanded. As a result, an increase in random noise of the selection transistor 115 or the amplifier transistor 114 can be suppressed. This leads to improvement in image quality of an image.

Figure 5A:
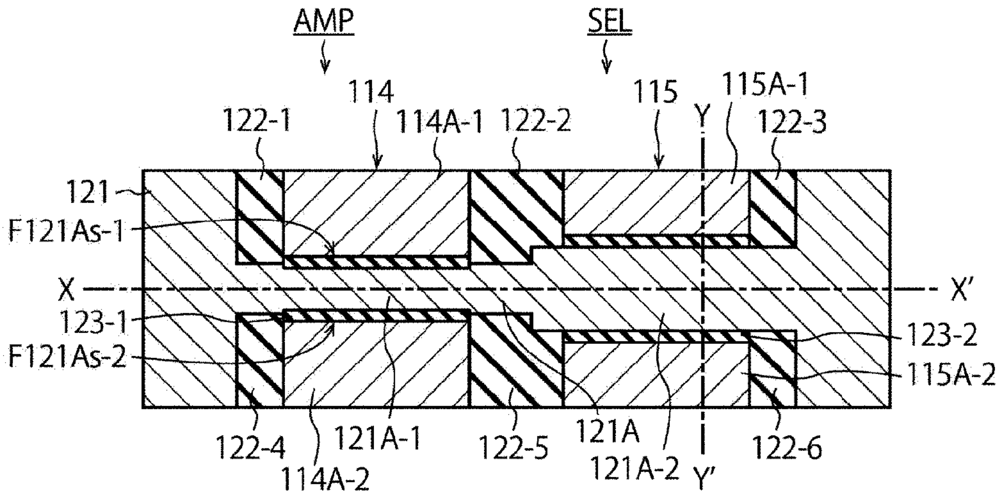
FIG. 5A is a plan view illustrating a configuration example of an amplifier transistor and a selection transistor.
Figure 5B:
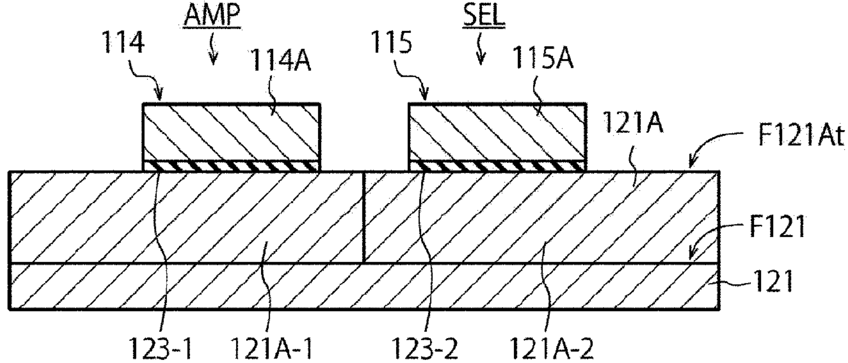
FIG. 5B is a cross-sectional view taken along line X-X.
Figure 5C:
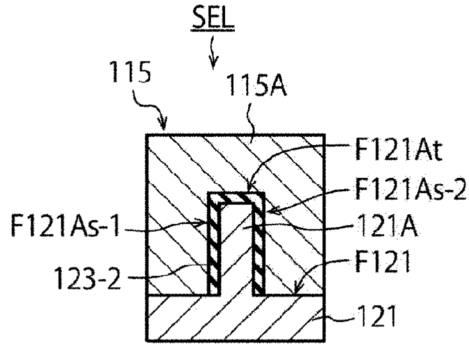
FIG. 5C is a cross-sectional view taken along line Y-Y.

In the present embodiment, the amplifier transistor 114 and the selection transistor 115 are Fin-type field effect transistors (FETs). As illustrated in FIGS. 5A, 5B, and 5C, the Fin-type FET is an example of the multi-gate transistor, and includes a fin-shaped region (fin region) 121A provided between a source and a drain, and gate electrodes 114A and 115A covering an upper surface and both side surfaces of the fin region 121A.

FIG. 5A is a plan view illustrating a configuration example of the amplifier transistor 114 and the selection transistor 115. FIG. 5B is a cross-sectional view taken along line X-X. FIG. 5C is a cross-sectional view taken along line Y-Y.

As illustrated in FIG. 5A, the amplifier transistor 114 and the selection transistor 115 are provided adjacent to each other. A channel region (a first channel region) 112A-1 of the amplifier transistor 114 and a channel region (a second channel region) 112A-2 of the selection transistor 115 are provided in the continuous fin region 121A. The channel region 112A-1 of the amplifier transistor 114 and the channel region 112A-2 of the selection transistor 115 are provided in a continuous and integrated fin semiconductor region. In the fin region 121A between the amplifier transistor 114 and the selection transistor 115, a common source/drain diffusion layer or a common lightly doped drain (LDD) is provided. Therefore, the amplifier transistor 114 and the selection transistor 115 are electrically connected via the source/drain diffusion layer or the LDD. The fin region 121A includes channel regions 121A-1 and 121A-2.

As illustrated in FIG. 5A, gate electrodes 114A-1 and 114A-2 of the amplifier transistor 114 are provided so as to face side surfaces F121As-1 and F121As-2 of the channel region 112A-1, respectively. Gate electrodes 115A-1 and 115A-2 of the amplifier transistor 115 are provided so as to face side surfaces F121As-1 and F121As-2 of the channel region 112A-2, respectively.

Furthermore, as illustrated in FIG. 5B, the gate electrode 114A of the amplifier transistor 114 is provided on an upper surface F121At of the channel region 121A-1. The gate electrodes 114A-1 and 114A-2 are electrically connected via the gate electrode 114A, and function as one gate electrode. The gate electrodes 114A-1, 114A-2, and 114A are integrally formed by the same conductive material (for example, doped polysilicon, metal, or the like).

The gate electrode 115A of the selection transistor 115 is provided next to the gate electrode 114A on the upper surface F121At of the channel region 121A-2. The gate electrodes 115A-1 and 115A-2 are electrically connected via the gate electrode 115A, and function as one gate electrode. The gate electrodes 115A-1, 115A-2, and 115A are integrally formed by the same conductive material (for example, doped polysilicon, metal, or the like).

As illustrated in FIG. 5C, the fin region 121A (the channel regions 121A-1 and 121A-2) extends in a direction substantially perpendicular to a surface F121 of the semiconductor substrate 121. The fin region 121A is formed by processing the semiconductor substrate 121, and is integrally formed by the same semiconductor material (for example, silicon) as the semiconductor substrate 121.

Between the gate electrodes 114A, 114A-1, and 114A-2 and the channel region 121A-1, a gate insulating film 123-1 is provided. The gate electrodes 114A, 114A-1, and 114A-2 are electrically insulated from the channel region 121A-1 by the gate insulating film 123-1. Between the gate electrodes 115A, 115A-1, and 115A-2 and the channel region 121A-2, a gate insulating film 123-2 is provided. The gate electrodes 115A, 115A-1, and 115A-2 are electrically insulated from the channel region 121A-2 by the gate insulating film 123-2. For the gate insulating films 123-1 and 123-2, for example, an insulating material such as a silicon oxide film is used.

As described above, the amplifier transistor 114 and the selection transistor 115 are configured by two Fin-type FETs provided adjacent to each other in the same fin region 121A.

Around the amplifier transistor 114 and the selection transistor 115, insulating films 122-1 to 122-6 are formed. The insulating films 122-1 to 122-6 are also collectively referred to as an insulating film 122. For example, a silicon oxide film is used for the insulating film 122.

By applying the Fin-type FET as the amplifier transistor 114 and the selection transistor 115 in this manner, an effective channel width can be expanded in both the selection transistor 115 and the amplifier transistor 114. As a result, random noise included in a signal from the pixel 100 can be reduced, and image quality is improved.

Note that the channel regions 121A-1 and 121A-2 may be substantially linear in the planar layout illustrated in FIG. 5A, or may be bent between the channel region 121A-1 and the channel region 121A-2.

Next, the channel regions 121A-1 and 121A-2 of the amplifier transistor 114 and the selection transistor 115 will be described in more detail.

Figure 6:
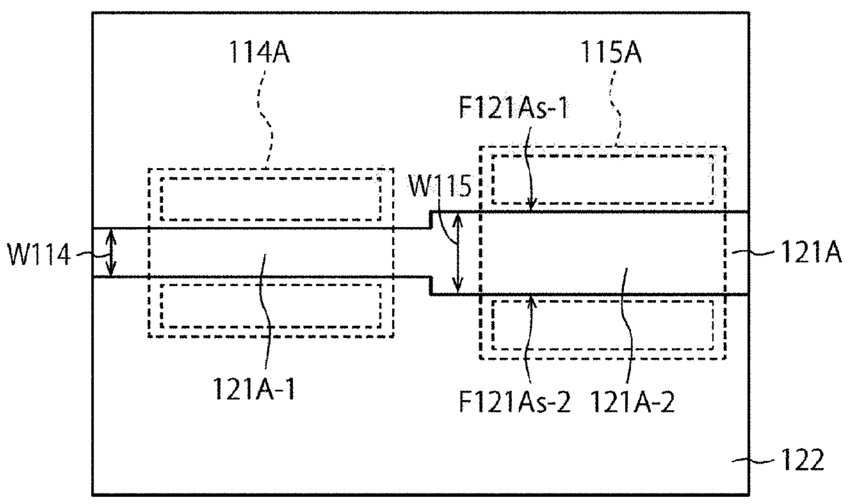
FIG. 6 is a schematic plan view illustrating an example of a channel region and a gate electrode of the amplifier transistor and the selection transistor.
Figure 7:
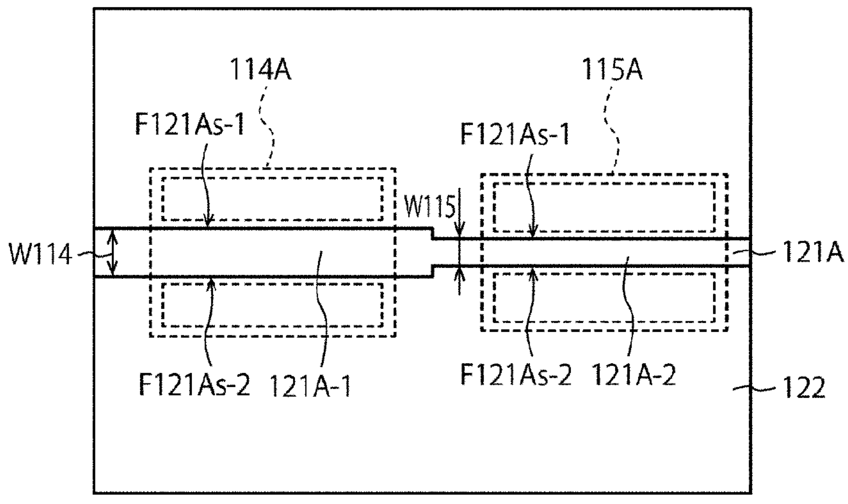
FIG. 7 is a schematic plan view illustrating an example of the channel region and the gate electrode of the amplifier transistor and the selection transistor.

FIGS. 6 and 7 are schematic plan views illustrating examples of the channel regions 121A-1 and 121A-2 and the gate electrodes 114A and 115A of the amplifier transistor 114 and the selection transistor 115. In the present embodiment, a width W114 of the channel region 121A-1 of the amplifier transistor 114 is different from a width W115 of the channel region 121A-2 of the selection transistor 115.

The width W114 as a first width is a width between both side surfaces F121As-1 and F121As-2 of the channel region 121A-1 of the amplifier transistor 114. The width W115 as a second width is a width between both side surfaces F121As-1 and F121As-2 of the channel region 121A-2 of the selection transistor 115.

For example, in FIG. 6, the width W115 is larger than the width W114. In this case, when impurity concentrations of the channel regions 121A-1 and 121A-2 are substantially equal, a threshold voltage of the selection transistor 115 becomes lower than a threshold voltage of the amplifier transistor 114. This is because the width W115 of the upper surface F121At of the channel region 112A of the selection transistor 115 is larger, and the selection transistor 115 is closer to the planer transistor.

For example, in FIG. 7, the width W115 is smaller than the width W114. In this case, when impurity concentrations of the channel regions 121A-1 and 121A-2 are substantially equal, a threshold voltage of the selection transistor 115 is larger than a threshold voltage of the amplifier transistor 114. This is because the width W115 of the upper surface F121At of the channel region 112A of the selection transistor 115 is small, and the selection transistor 115 is closer to the Fin type (vertical channel type) transistor.

As described above, in the present embodiment, the widths W114 and W115 of the channel regions 121A-1 and 121A-2 of the amplifier transistor 114 and the selection transistor 115 are made different from each other. As a result, the individual threshold voltages of the amplifier transistor 114 and the selection transistor 115 can be adjusted.

Usually, a threshold voltage of a transistor of a pixel is adjusted by introducing impurities into a channel region. On the other hand, the threshold voltages of the amplifier transistor 114 and the selection transistor 115 of the pixel 100 according to the present embodiment are adjusted by using the widths W114 and W115 of the channel regions 121A-1 and 121A-2, respectively. Therefore, in the present embodiment, a process of introducing impurities into the channel regions 121A-1 and 121A-2 in order to adjust the threshold voltage becomes unnecessary. For example, a lithography process and an ion implantation process for selectively introducing impurities into any one of the channel regions 121A-1 and 121A-2 can be omitted. This leads to reduction of a manufacturing process of the solid-state imaging element.

Furthermore, since the impurities for threshold value adjustment are not introduced into the channel regions 121A-1 and 121A-2, the impurity concentrations of the channel regions 121A-1 and 121A-2 are substantially equal. Therefore, impurities do not diffuse between the channel region 121A-1 and the channel region 121A-2, and it is possible to suppress an influence on characteristics such as a threshold voltage between the amplifier transistor 114 and the selection transistor 115. Therefore, even if a distance between the amplifier transistor 114 and the selection transistor 115 is shortened, the characteristics of the amplifier transistor 114 and the selection transistor 115 are hardly changed. As a result, each pixel 100 can be miniaturized.

As described above, in the present embodiment, by applying the Fin-type transistor to the amplifier transistor 114 and the selection transistor 115, a layout area can be reduced as compared with a pixel to which the planar type transistor is applied. Moreover, the pixel 100 can be miniaturized by adjusting the threshold voltages by using the widths W114 and W115 of the channel regions 121A-1 and 121A-2. As a result, the solid-state imaging element according to the present embodiment can achieve both adjustment of the characteristics of the transistors of the pixels 100 and miniaturization of the pixels.

Furthermore, since the impurities for threshold value adjustment are not introduced into the channel regions 121A-1 and 121A-2, it also leads to suppression of generation of random noise in the threshold voltages of the amplifier transistor 114 and the selection transistor 115. For example, there is a case where impurities are ion-implanted into the channel region 121A-2 in order to adjust the threshold voltage of the selection transistor 115. In this case, impurities in the channel region 121A-2 of the selection transistor 115 diffuse into the channel region 121A-1 of the amplifier transistor 114, which causes deterioration of characteristics of the amplifier transistor 114 or causes random noise. On the other hand, in the present embodiment, since impurities are not introduced into the channel region 121A-2 of the selection transistor 115, the impurity concentrations of the channel regions 121A-1 and 121A-2 are substantially equal. Therefore, random noise can be reduced without deterioration of the characteristics of the amplifier transistor 114.

Next, a method for manufacturing the solid-state imaging element according to the present embodiment will be described.

FIGS. 8A, 8B, 9A, 9B, 10A, 10B, 11A, 11B, 12A, and 12B are a plan view and a cross-sectional view illustrating an example of the method for manufacturing the solid-state imaging element according to the present embodiment. Note that, FIGS. 8B, 9B, 10B, 11B, and 12B illustrate cross sections taken along line B-B illustrated in FIGS. 8A, 9A, 10A, 11A, and 12A, respectively. Note that, here, while focusing on a process of forming the amplifier transistor 114 and the selection transistor 115 among the configurations of the pixel 100, a description of a manufacturing method for other configurations is omitted.

Figure 8A:
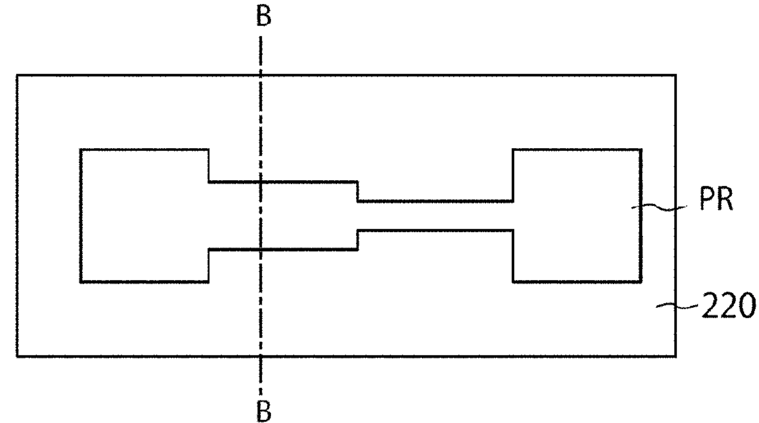
FIG. 8A is a plan view illustrating an example of a method for manufacturing a solid-state imaging element according to the present embodiment.
Figure 8B:
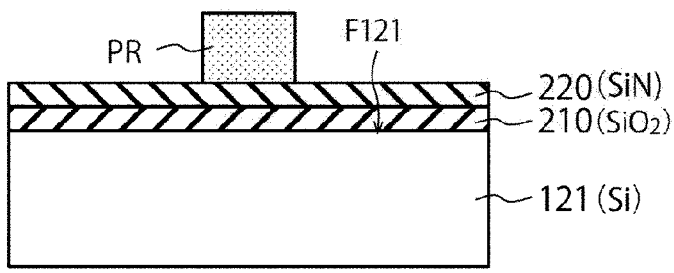
FIG. 8B is a cross-sectional view illustrating an example of the method for manufacturing the solid-state imaging element according to the present embodiment.

First, a silicon oxide film 210 is formed on the surface F121 of the semiconductor substrate 121, and a silicon nitride film 220 is formed on the silicon oxide film 210. Next, a photoresist PR is applied onto the silicon nitride film 220 by using a lithography technique, and the photoresist PR is patterned in a pattern of an active area of the amplifier transistor 114 and the selection transistor 115. At this time, in the channel regions 121A-1 and 121A-2, the photoresist PR is patterned in the layout of the fin-shaped channel regions 121A-1 and 121A-2. The photoresist PR is patterned such that individual widths of the channel regions 121A-1 and 121A-2 are formed to have predetermined widths W114 and W115. As a result, the structure illustrated in FIGS. 8A and 8B is obtained.

Figure 9A:
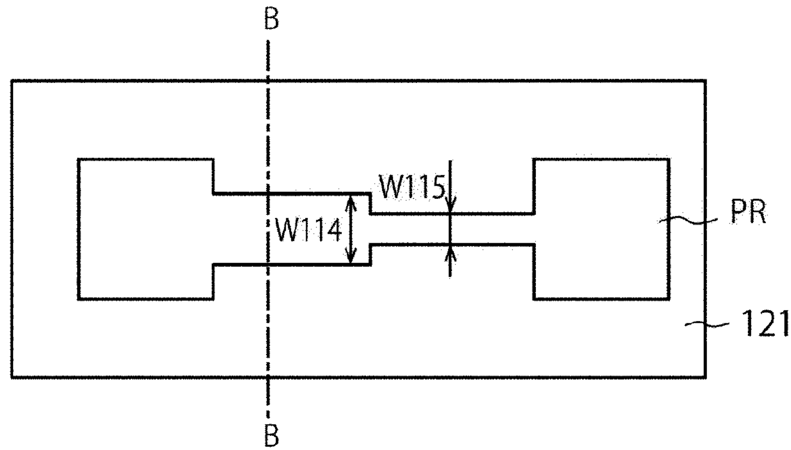
FIG. 9A is a plan view illustrating an example of the method for manufacturing the solid-state imaging element according to the present embodiment.
Figure 9B:
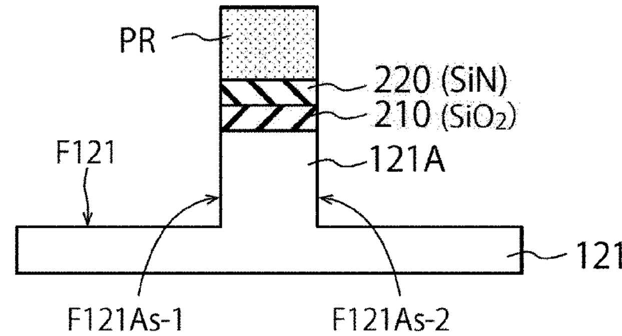
FIG. 9B is a cross-sectional view illustrating an example of the method for manufacturing the solid-state imaging element according to the present embodiment.

Next, using the photoresist PR as a mask, the silicon nitride film 220 and the silicon oxide film 210 are etched by an etching technique such as a reactive ion etching (RIE) method. Moreover, an upper portion of the semiconductor substrate 121 is etched using the photoresist PR, the silicon nitride film 220, or the silicon oxide film 210 as a mask. As a result, the structure illustrated in FIGS. 9A and 9B is obtained. At this time, the fin region 121A is formed as illustrated in FIG. 9B. The fin region 121A extends in a substantially perpendicular direction from the surface F121 of the semiconductor substrate 121, and has both side surfaces F121As-1 and F121As-2 of the fin region 121A. At this time, the channel regions 121A-1 and 121A-2 included in the fin region 121A are integrally formed by the same material so as to have mutually different widths W114 and W115.

Figure 10A:
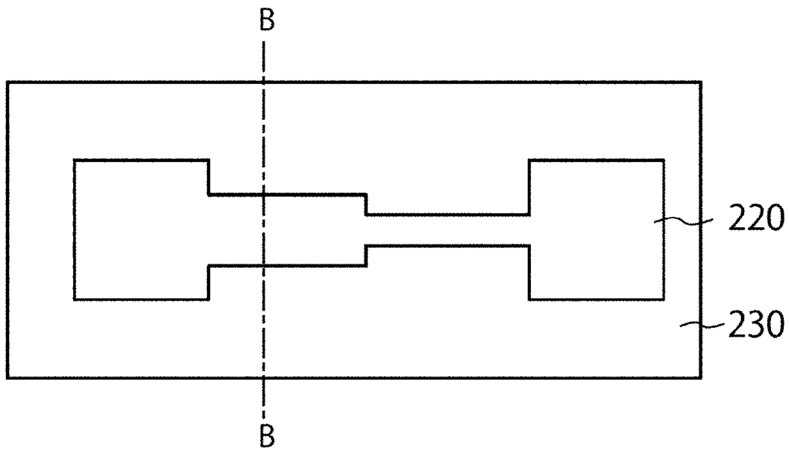
FIG. 10A is a plan view illustrating an example of the method for manufacturing the solid-state imaging element according to the present embodiment.
Figure 10B:
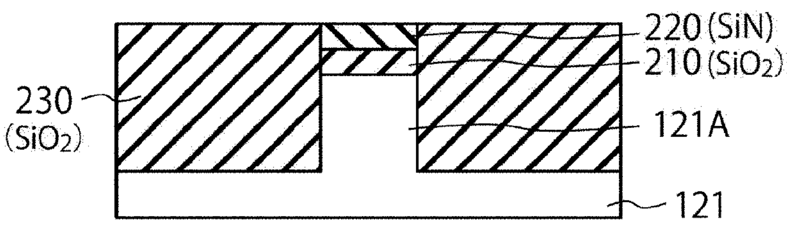
FIG. 10B is a cross-sectional view illustrating an example of the method for manufacturing the solid-state imaging element according to the present embodiment.

After the photoresist PR is removed, as illustrated in FIGS. 10A and 10B, a silicon oxide film 230 is deposited on the semiconductor substrate 121 and the silicon nitride film 220. Moreover, the silicon oxide film 230 is polished using a chemical mechanical polishing (CMP) method until the silicon nitride film 220 is exposed.

Figure 11A:
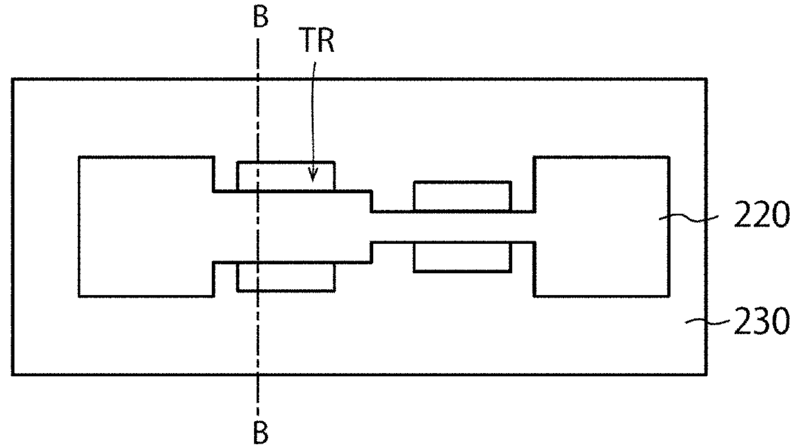
FIG. 11A is a plan view illustrating an example of the method for manufacturing the solid-state imaging element according to the present embodiment.
Figure 11B:
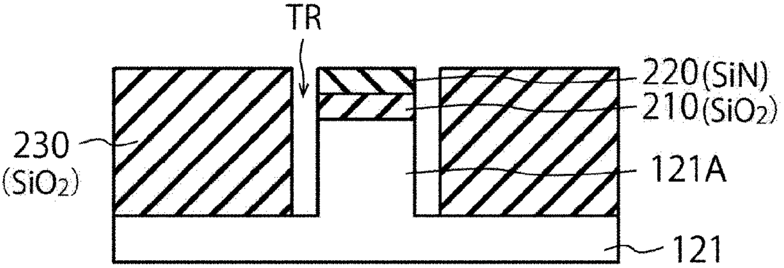
FIG. 11B is a cross-sectional view illustrating an example of the method for manufacturing the solid-state imaging element according to the present embodiment.

Next, as illustrated in FIGS. 11A and 11B, the silicon oxide film 230 on both side surfaces F121As-1 and F121As-2 of the fin region 121A is etched using a lithography technique and an etching technique. As a result, a groove TR for embedding the gate electrodes 114A and 115A is dug in a formation region of the gate electrodes 114A and 115A. At a bottom portion of the groove TR, the semiconductor substrate 121 is exposed. Note that, in the processes of FIGS. 10A, 10B, 11A, and 11B, the ion implantation process into the fin region 121A is not performed.

Figure 12A:
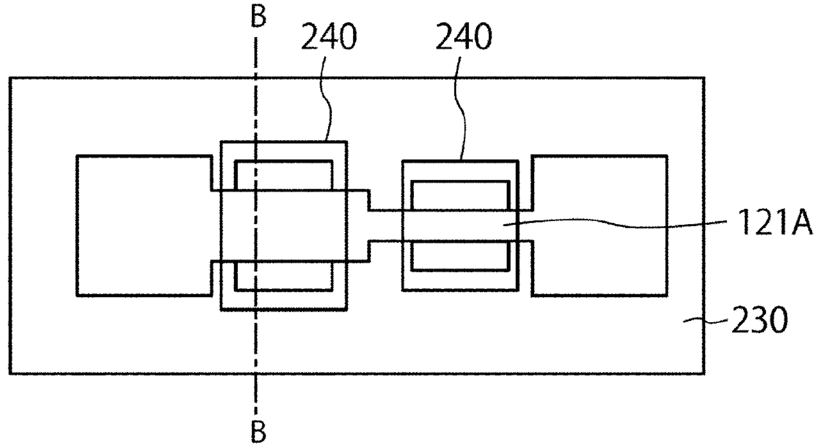
FIG. 12A is a plan view illustrating an example of the method for manufacturing the solid-state imaging element according to the present embodiment.
Figure 12B:
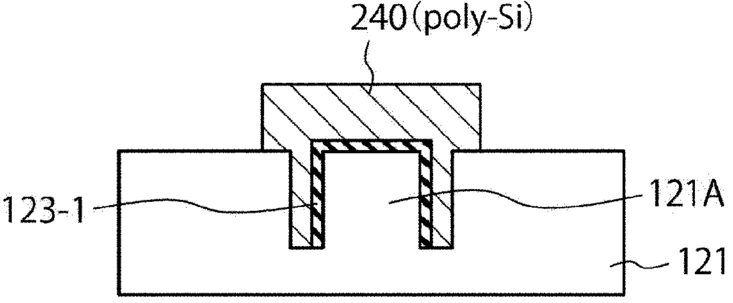
FIG. 12B is a cross-sectional view illustrating an example of the method for manufacturing the solid-state imaging element according to the present embodiment.

Next, after the silicon nitride film 220 is removed, as illustrated in FIGS. 12A and 12B, the gate insulating film 123-1 is formed on an upper surface and both side surfaces of the fin region 121A. Next, polysilicon 240 is deposited, and the polysilicon 240 is embedded in the groove TR. Furthermore, the polysilicon 240 is also deposited on the upper surface of the fin region 121A. Moreover, the polysilicon 240 is processed into a pattern of the gate electrodes 114A and 115A by using a lithography technique and an etching technique. The gate electrodes 114A and 115A respectively cover the channel region 121A-1 of the amplifier transistor 114 and the channel region 121A-2 of the selection transistor 115.

Next, although not illustrated, impurities are introduced using the gate electrodes 114A and 115A as masks, and the source-drain diffusion layer or the LDD is formed on both sides of the channel regions 121A-1 and 121A-2.

Thereafter, the insulating film 122 is deposited, and the structure illustrated in FIGS. 5A, 5B, and 5C are obtained. As a result, the amplifier transistor 114 and the selection transistor 115 having the fin region 121A according to the present embodiment are completed.

The transfer transistor 112 and the reset transistor 113 may also use the Fin-type transistor according to the present embodiment. In this case, the transfer transistor 112 and the reset transistor 113 can also control a threshold voltage by adjusting a width of an upper surface of a channel region without introducing impurities. In this manner, the Fin-type transistor according to the present embodiment may be applied to all the transistors included in the pixel 100. That is, the channel region of the transfer transistor 112 may extend in a direction substantially perpendicular to the surface F121 of the semiconductor substrate 121. A gate electrode of the transfer transistor 112 is provided on an upper surface and both side surfaces of a channel region of the transfer transistor 112. Furthermore, a channel region of the reset transistor 113 as the fourth transistor may extend in a direction substantially perpendicular to the surface F121 of the semiconductor substrate 121. A gate electrode of the reset transistor 113 is provided on an upper surface and both side surfaces of a channel region of the reset transistor 113. In this case, it suffices that cross-sectional configurations of the transfer transistor 112 and the reset transistor 113 are similar to the cross-sectional configuration of the amplifier transistor 114 or the selection transistor 115. Widths of the upper surfaces of the channel regions of the transfer transistor 112 and the reset transistor 113 are adjusted according to threshold voltages of the transfer transistor 112 and the reset transistor 113. As a result, the manufacturing process of the solid-state imaging element can be further reduced, and the pixel 100 can be further miniaturized.

In this way, the individual threshold voltages of the amplifier transistor 114 and the selection transistor 115 according to the present embodiment are adjusted by using the widths W114 and W115 of the channel regions 121A-1 and 121A-2. Ion implantation into the channel regions 121A-1 and 121A-2 is not performed. Therefore, a lithography process and an ion implantation process for selectively introducing impurities into the channel region 121A-1 or 121A-2 are unnecessary. This leads to reduction in the manufacturing process of the solid-state imaging element, leading to reduction in manufacturing cost.

Figure 13:
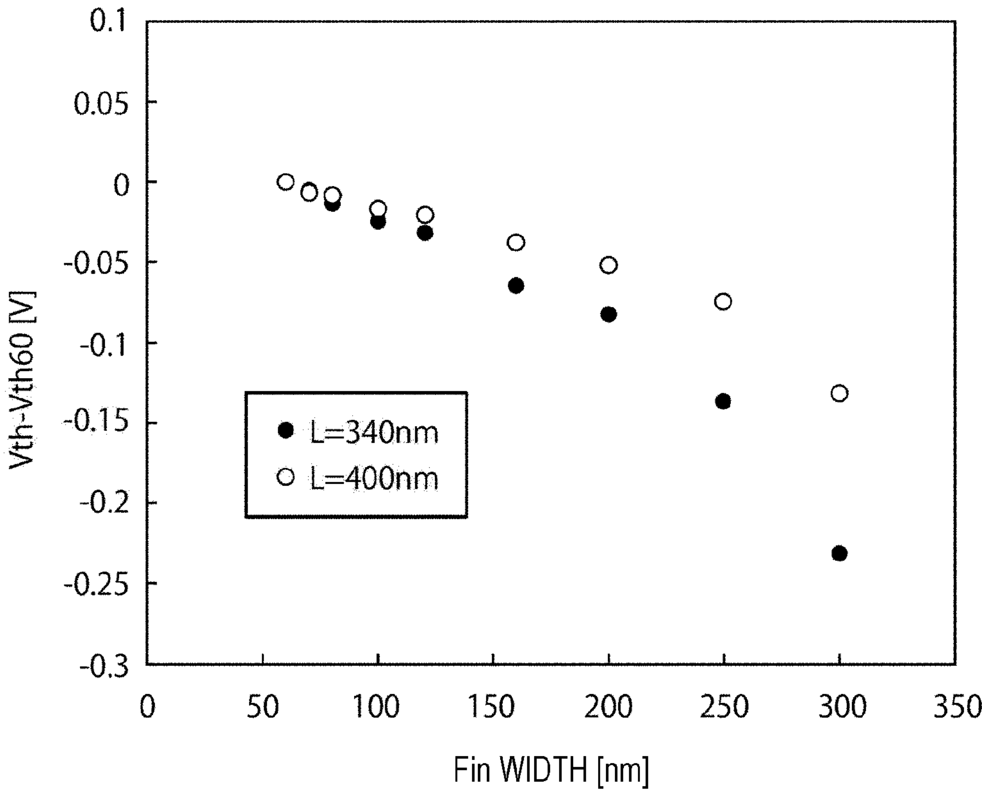
FIG. 13 is a graph illustrating a relationship between a width of an upper surface of a fin-type channel region and a threshold voltage of a Fin-type transistor.

FIG. 13 is a graph illustrating a relationship between a width of an upper surface of the fin-type channel region and a threshold voltage of the Fin-type transistor. A horizontal axis indicates the width of the upper surface of the fin-type channel region, and a vertical axis indicates a relative value (Vth-Vth 60) obtained by subtracting a threshold voltage Vth 60 of the Fin-type transistor having a Fin width of 60 nm from a threshold voltage Vth of the Fin-type transistor having various Fin widths. This graph illustrates a Fin-type transistor having a channel length L of 340 nm and a Fin-type transistor having a channel length L of 400 nm.

According to this graph, it can be seen that the threshold voltage of the Fin-type transistor decreases as the width (for example, W114 and W115) of the upper surface of the fin-type channel region increases, regardless of the channel length L. Conversely, it can be seen that the threshold voltage of the Fin-type transistor increases as the width of the upper surface of the fin-type channel region decreases. According to the present disclosure, the threshold voltage of the pixel 100 can be adjusted using such a relationship.

(Fixed Phrase for Vehicle-Mounted)

The technology (the present technology) according to the present disclosure can be applied to various products. For example, the technology according to the present disclosure may be realized as a device equipped on any type of mobile bodies, such as an automobile, an electric car, a hybrid electric car, a motorcycle, a bicycle, personal mobility, an airplane, a drone, a ship, a robot, and the like.

Figure 14:
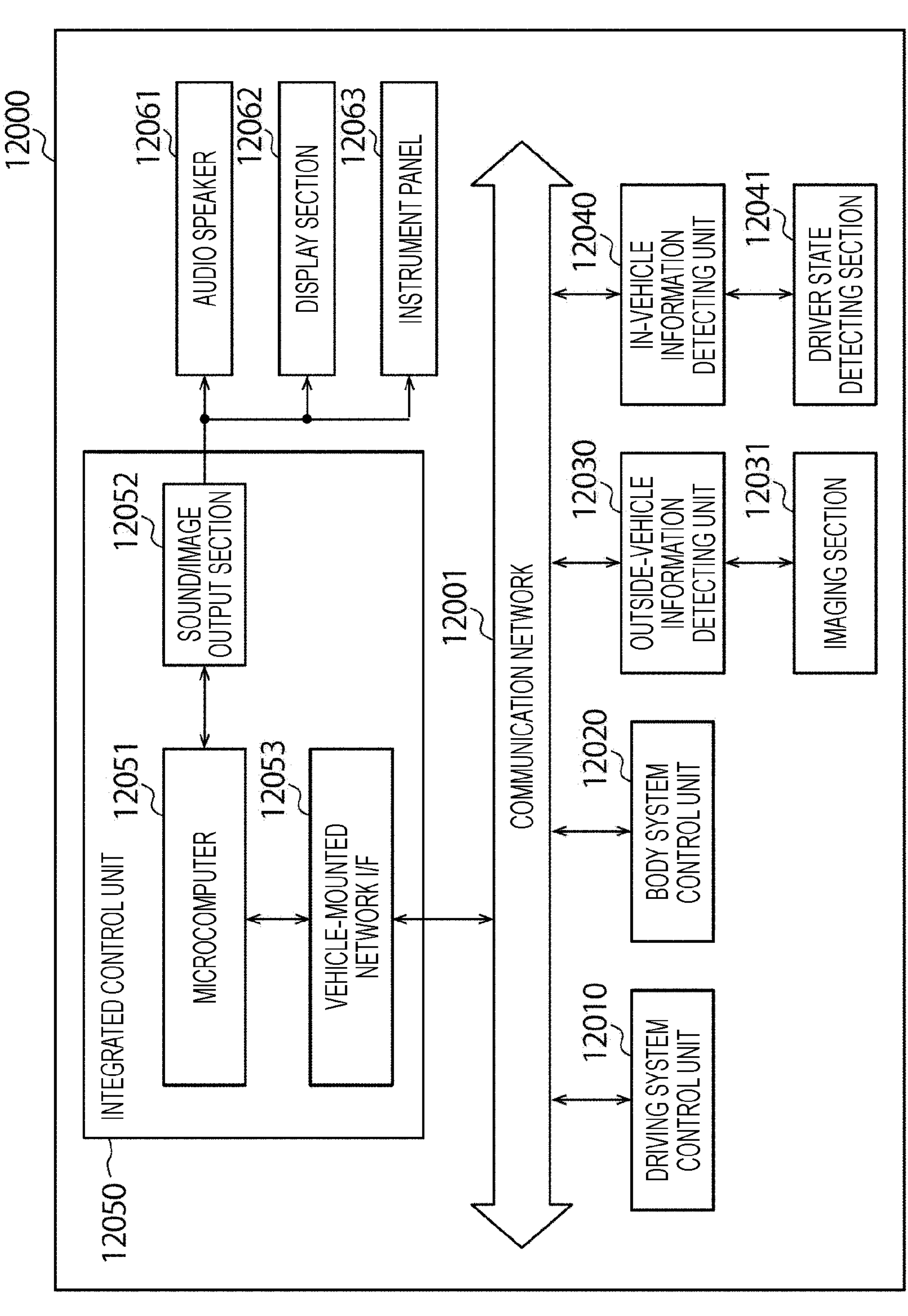
FIG. 14 is a block diagram illustrating a schematic configuration example of a vehicle control system, which is an example of a mobile body control system to which the technology according to the present disclosure may be applied.

FIG. 14 is a block diagram illustrating an example of schematic configuration of a vehicle control system as an example of a mobile body control system to which the technology according to an embodiment of the present disclosure can be applied.

A vehicle control system 12000 includes a plurality of electronic control units connected to each other via a communication network 12001. In the example illustrated in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12030 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display and a head-up display.

Figure 15:
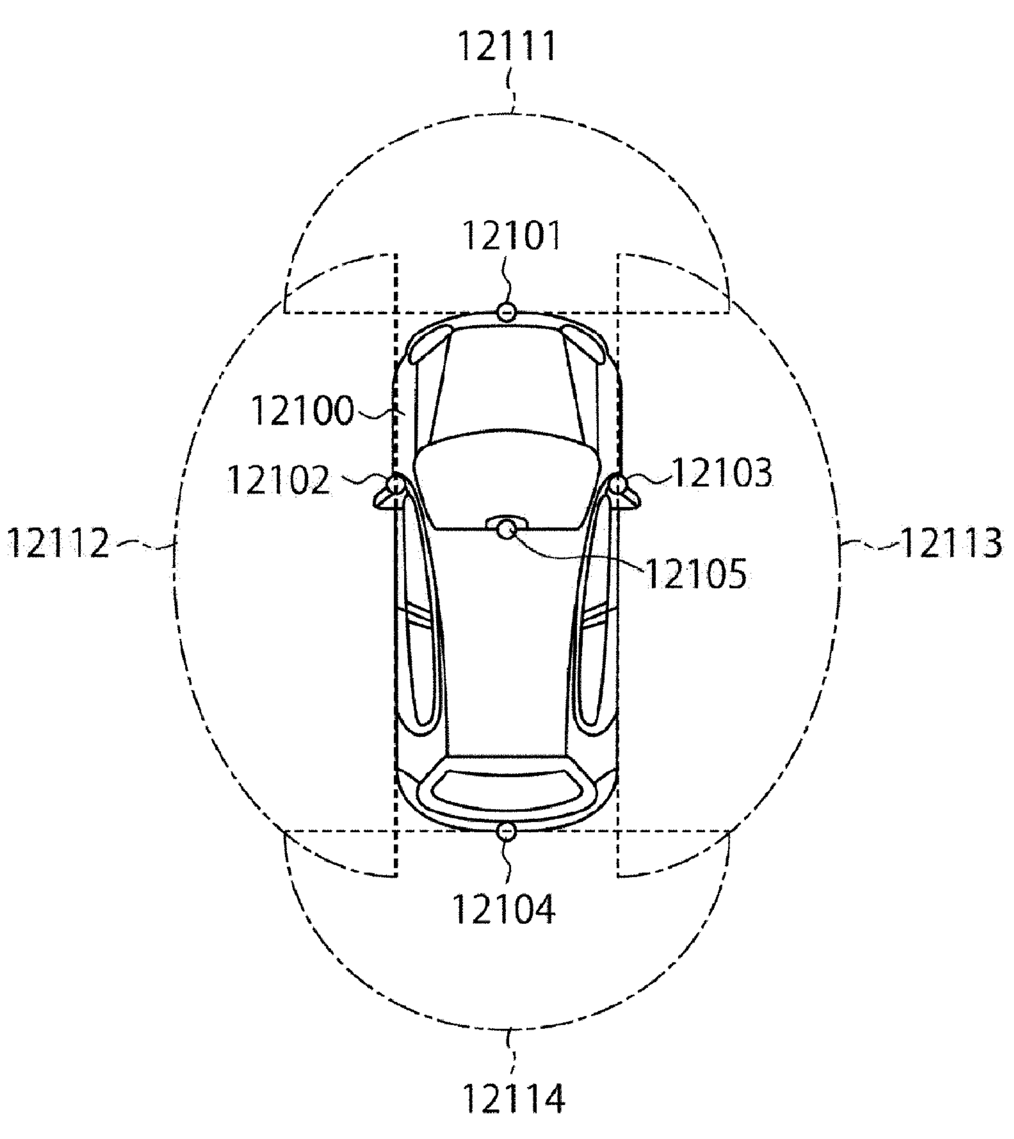
FIG. 15 is a diagram illustrating an example of an installation position of an imaging section.

FIG. 15 is a diagram illustrating an example of the installation position of the imaging section 12031.

In FIG. 15, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of a vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 15 illustrates an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure can be applied to, for example, the imaging section 12031 among the above-described configurations. As a result, it is possible to achieve both adjustment of the characteristics of the pixel transistor of the solid-state imaging element and miniaturization of the pixels.

Note that the present technology can have the following configurations.

(1)

A solid-state imaging element including a plurality of pixels provided on a surface of a substrate, each of the pixels including:

a photoelectric conversion section configured to convert light into an electric charge;

a first transistor having one end connected to the photoelectric conversion section;

a second transistor provided between a first power supply and a first signal line; and a third transistor connected between the second transistor and the first signal line, in which the second transistor includes a first channel region extending in a direction substantially perpendicular to the surface of the substrate, and a first gate electrode provided on an upper surface and both side surfaces of the first channel region and connected to another end of the first transistor, the third transistor has a second channel region extending in a direction substantially perpendicular to the surface of the substrate, and a second gate electrode provided on an upper surface and both side surfaces of the second channel region, and a first width between both side surfaces of the first channel region and a second width between both side surfaces of the second channel region are different from each other.

(2)

The solid-state imaging element according to (1), in which impurity concentrations of the first and second channel regions are substantially equal.

(3)

The solid-state imaging element according to (1) or (2), in which in a case where the second width is larger than the first width, a threshold voltage of the third transistor is lower than a threshold voltage of the second transistor, and in a case where the second width is smaller than the first width, a threshold voltage of the third transistor is higher than a threshold voltage of the second transistor.

(4)

The solid-state imaging element according to any one of (1) to (3), in which the first and second channel regions are connected in series between the first power supply and the first signal line.

(5)

The solid-state imaging element according to any one of (1) to (4), in which the first and second channel regions are made by a material same as the substrate to be integrally continuous.

(6)

The solid-state imaging element according to any one of (1) to (5), in which a channel region of the first transistor extends in a direction substantially perpendicular to the surface of the substrate, and a gate electrode of the first transistor is provided on an upper surface and both side surfaces of the channel region of the first transistor.

(7)

The solid-state imaging element according to any one of (1) to (6), further including:

a fourth transistor connected between the one end of the first transistor and the first power supply, in which a channel region of the fourth transistor extends in a direction substantially perpendicular to the surface of the substrate, and a gate electrode of the fourth transistor is provided on an upper surface and both side surfaces of the channel region of the fourth transistor.

(8)

The solid-state imaging element according to (7), in which the first transistor transfers an electric charge from the photoelectric conversion section to a floating diffusion region capable of temporarily accumulating the electric charge, the second transistor is brought into a conductive state according to a voltage of the floating diffusion region, when each of the pixels is selected, the third transistor electrically connects the second transistor to the first signal line and transmits an electric signal corresponding to a voltage of the floating diffusion region to the first signal line, and the fourth transistor is brought into a conductive state when an electric charge in the floating diffusion region is removed to the first power supply.

(9)

The solid-state imaging element according to any one of (1) to (8), in which the second and third transistors are Fin-type transistors.

(10)

A method for manufacturing a solid-state imaging element including a plurality of pixels, each of the pixels including: a photoelectric conversion section configured to convert light into an electric charge; a first transistor having one end connected to the photoelectric conversion section; a second transistor provided between a first power supply and a first signal line; and a third transistor connected between the second transistor and the first signal line, the method including:

selectively etching a surface of a substrate to form a first channel region of the second transistor and a second channel region of the third transistor, the first channel region having a first width and extending in a direction substantially perpendicular to the surface of the substrate, and the second channel region having a second width and extending in a direction substantially perpendicular to the surface of the substrate; and forming a first gate electrode of the second transistor on an upper surface and both side surfaces of the first channel region, and forming a second gate electrode of the third transistor on an upper surface and both side surfaces of the second channel region, in which the first width and the second width are different from each other.

(11)

The method according to (10), in which impurity concentrations of the first and second channel regions are substantially equal.

(12)

The method according to (1)0 or (11), in which the first and second channel regions are made by a material same as the substrate to be integrally continuous.

(13)

The method according to any one of (10) to (12), in which, after the first and second channel regions are formed, no impurity is introduced into the first and second channel regions.

Note that the present disclosure is not limited to the above-described embodiment, and various modifications can be made without departing from the gist of the present disclosure. Furthermore, the effects described in this specification are merely examples and are not limited, and other effects may be present.

REFERENCE SIGNS LIST

100 Pixel
111 Photodiode
112 Transfer transistor
113 Reset transistor
114 Amplifier transistor
115 Selection transistor
121A-1, 121A-2 Channel region
123-1, 123-2 Gate insulating film
114A, 114A-1, 114A-2 Gate electrode

The invention claimed is:

1. A solid-state imaging element, comprising:

a plurality of pixels on a surface of a substrate, wherein each pixel of the plurality of pixels comprises:

a photoelectric conversion section configured to convert light into an electric charge;

a first transistor, wherein a first end of the first transistor is connected to the photoelectric conversion section;

a second transistor connected between a first power supply and a first signal line; and a third transistor connected between the second transistor and the first signal line, wherein the second transistor includes:

a first channel region extending in a direction substantially perpendicular to the surface of the substrate, and a first gate electrode on an upper surface of the first channel region and both side surfaces of the first channel region, the second transistor is connected to a second end of the first transistor, the third transistor includes:

a second channel region extending in the direction substantially perpendicular to the surface of the substrate, and a second gate electrode on an upper surface of the second channel region and both side surfaces of the second channel region, and the first channel region of the second transistor has a first width, the second channel region of the third transistor has a second width, the first width is between the both side surfaces of the first channel region, the second width is between the both the side surfaces of the second channel region, the second width of the second channel region of the third transistor is larger than the first width of the first channel region of the second transistor, the second transistor is an amplifier transistor, and the third transistor is a selection transistor.

2. The solid-state imaging element according to claim 1, wherein impurity concentration of the first channel region and impurity concentration of the second channel region are substantially equal.

3. The solid-state imaging element according to claim 1, wherein a threshold voltage of the third transistor is lower than a threshold voltage of the second transistor.

4. The solid-state imaging element according to claim 1, wherein the first channel region and the second channel region are connected in series between the first power supply and the first signal line.

5. The solid-state imaging element according to claim 1, wherein the first channel region and the second channel region comprise a material same as the substrate.

6. The solid-state imaging element according to claim 1, wherein a third channel region of the first transistor extends in the direction substantially perpendicular to the surface of the substrate, and a third gate electrode of the first transistor is on an upper surface of the third channel region of the first transistor and both side surfaces of the third channel region of the first transistor.

7. The solid-state imaging element according to claim 1, further comprising a fourth transistor connected between the first end of the first transistor and the first power supply, wherein a fourth channel region of the fourth transistor extends in the direction substantially perpendicular to the surface of the substrate, and a fourth gate electrode of the fourth transistor is on an upper surface of the fourth channel region of the fourth transistor and both side surfaces of the fourth channel region of the fourth transistor.

8. The solid-state imaging element according to claim 7, further comprising a floating diffusion region, wherein the first transistor is configured to transfer the electric charge from the photoelectric conversion section to the floating diffusion region, the floating diffusion region is configured to accumulate the electric charge, the second transistor is in a conductive state based on a voltage of the floating diffusion region, in a case where the each pixel of the plurality of pixels is selected, the third transistor is configured to:

electrically connect the second transistor to the first signal line; and transmit an electric signal corresponding to the voltage of the floating diffusion region to the first signal line, and the fourth transistor is in a conductive state in a case where the electric charge in the floating diffusion region is removed to the first power supply.

9. The solid-state imaging element according to claim 1, wherein the second transistor and the third transistor include Fin-type transistors.

* * * * *